(12) United States Patent
Svensson

(10) Patent No.: US 11,187,962 B2
(45) Date of Patent: Nov. 30, 2021

(54) REDUCING IMPACT OF CROSS-TALK BETWEEN MODULATORS THAT DRIVE A MULTI-CHANNEL AOM

(71) Applicant: Mycronic AB, Taby (SE)

(72) Inventor: Anders Svensson, Stockholm (SE)

(73) Assignee: Mycronic AB, Taby (SE)

( * ) Notice: Subject to any disclaimer, the term of this patent is extended or adjusted under 35 U.S.C. 154(b) by 32 days.

(21) Appl. No.: 16/221,296

(22) Filed: Dec. 14, 2018

(65) Prior Publication Data

US 2020/0192183 A1    Jun. 18, 2020

(51) Int. Cl.
  *G02F 1/33*   (2006.01)
  *G02F 1/11*   (2006.01)
  *G03F 7/20*   (2006.01)

(52) U.S. Cl.
  CPC .............. *G02F 1/332* (2013.01); *G02F 1/113* (2013.01); *G03F 7/704* (2013.01)

(58) Field of Classification Search
  CPC ... G02F 1/11; G02F 1/29; G02F 1/113; G02F 1/116; G02F 1/332; G02F 2002/008; G03F 7/704; G02B 21/008; G02B 21/0064; G06N 10/00
  See application file for complete search history.

(56) References Cited

U.S. PATENT DOCUMENTS

| | | |
|---|---|---|
| 3,935,566 A | 1/1976 | Snopko |
| 4,371,964 A | 2/1983 | Podmaniczky et al. |
| 9,958,710 B1 * | 5/2018 | Morse .................... G06N 10/00 |

(Continued)

FOREIGN PATENT DOCUMENTS

WO    99/03016 A1    1/1999

OTHER PUBLICATIONS

Li, Yinshu et al., Development of multichannel acousto-optic modulator,. SPIR 4231, Advanced Optial Manufacturing and Testing Technology 2000, Oct. 6, 2000, 6 page.

(Continued)

*Primary Examiner* — Mustak Choudhury
(74) *Attorney, Agent, or Firm* — Haynes Beffel & Wolfeld, LLP; Ernest J. Beffel, Jr.

(57) ABSTRACT

The disclosed technology teaches a method of reducing the impact of cross-talk between transducers that drive an acousto-optic modulator. The method includes operating the transducers, which are mechanically coupled to an acousto-optic modulator medium, with different frequencies applied to adjoining transducers and producing a time-varying phase relationship between carriers on spatially adjoining modulation channels emanating from the adjoining transducers, with a frequency separation between carriers on the adjoining channels of 400 KHz to 20 MHz. The disclosed technology also includes operating 5 to 32 modulators, which are mechanically coupled to the acousto-optic modulator crystal, and varying the different frequencies applied to the modulators in a sawtooth pattern, varying the different frequencies over a range and then repeating variation over the range. Also included is varying the frequencies applied to the modulators in a rising or falling pattern applied progressively to the spatially adjoining transducers.

16 Claims, 11 Drawing Sheets

(9 of 11 Drawing Sheet(s) Filed in Color)

(56) References Cited

U.S. PATENT DOCUMENTS

| | | | | |
|---|---|---|---|---|
| 2004/0151422 | A1* | 8/2004 | Shah | G02F 1/332 |
| | | | | 385/17 |
| 2015/0338718 | A1* | 11/2015 | Zhang | G02F 1/33 |
| | | | | 359/305 |
| 2017/0227748 | A1* | 8/2017 | Anhut | G02B 21/008 |
| 2017/0336697 | A1* | 11/2017 | Peled | G02F 1/33 |

OTHER PUBLICATIONS

PCT/EP2019/085022—International Search Report and Written Opinion dated Mar. 18, 2020, 9 pages.

\* cited by examiner

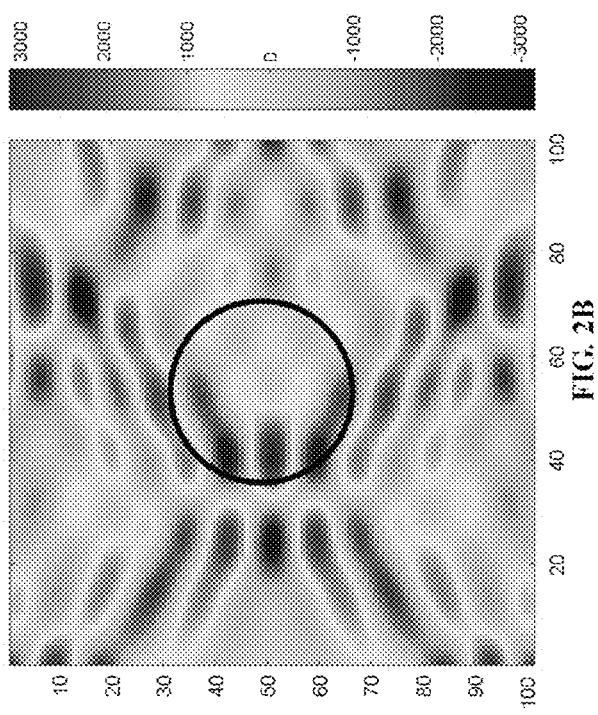
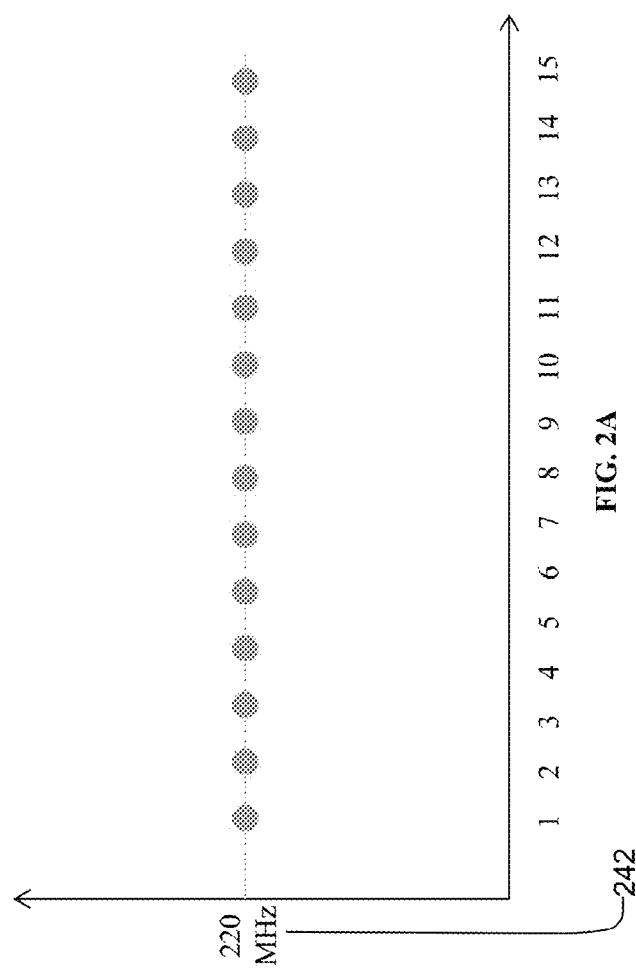
FIG. 2A
FIG. 2B

REDUCING IMPACT OF CROSS-TALK BETWEEN MODULATORS THAT DRIVE A MULTI-CHANNEL AOM

FIELD OF THE TECHNOLOGY DISCLOSED

The disclosed invention relates to pattern generation, direct-write lithography and to optical writing of patterns on a photosensitive surface in general. In particular it relates to the patterning of photomasks, wafers, printed circuit boards (PCBs), fine-pitch interconnection substrates, flexible substrates with or without active components (transistors) and/ or of panels for displays, photovoltaics and illumination. Other patterns with line widths from 0.03 to 10 microns may also use the technology disclosed. In particular the technology relates to high-precision pattern generators and direct writers using acousto-optic modulation.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may correspond to implementations of the claimed technology also.

Streaming video from smartphones and tablets require high-resolution displays, which are only possible with the use of advanced manufacturing tools, including laser mask writers for photomask production. Display mask writers are the de facto used in the industry for production of all high-resolution thin film transistor (TFT), liquid crystal display (LCD) and active-matrix organic light-emitting diode (AMOLED) displays worldwide.

Pattern generators are used to write microscopic images onto photomasks which then function as templates for mass production of displays, integrated circuits and electronic packaging. The manufacturing process, called microlithography, is similar to the way in which photographs are reproduced with the help of a negative. A microlithographic laser writer uses a laser beam to pattern a latent image in a photosensitive surface, such as resist on a mask, which is used, in turn, to pattern wafers or large area displays. In the photomask manufacturing industry, stringent requirements are placed on critical dimensions (CD).

Acousto-optic modulation is commonly used in laser scanners, providing a reasonable compromise between cost, speed and efficiency. The laser scanner using an acousto-optic modulator (AOM) may have a single beam or multiple beams and after the modulation of the beam it may be scanned by electro-optic or mechanical means. Prior art exists in the form of polygon scanners, and acousto-optic, all of them employing acousto-optic multibeam modulation.

The pattern line width measurement is a critical dimension (CD) also referred to as edge roughness, which varies as a result of variations in the signal for the laser dose, which is controlled using acousto-optic modulation. An opportunity arises to improve the stability of line widths, and thereby the critical dimensions for pattern generation, direct-write lithography and for optical writing of patterns on a photosensitive surface.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The color drawings also may be available in PAIR via the Supplemental Content tab.

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

FIG. 2A shows an example spatial-dimension graph for a multi-channel AOM for an array of fifteen channels of transducers integrated with a single acousto-optic crystal, operated at a carrier frequency of 220 MHz.

FIG. 2B shows a 3-dimensional pattern for sound waves leaking from adjacent AOM channels.

DETAILED DESCRIPTION

The following detailed description is made with reference to the figures. Sample implementations are described to illustrate the technology disclosed, not to limit its scope, which is defined by the claims. Those of ordinary skill in the art will recognize a variety of equivalent variations on the description that follows.

Figure 1A:
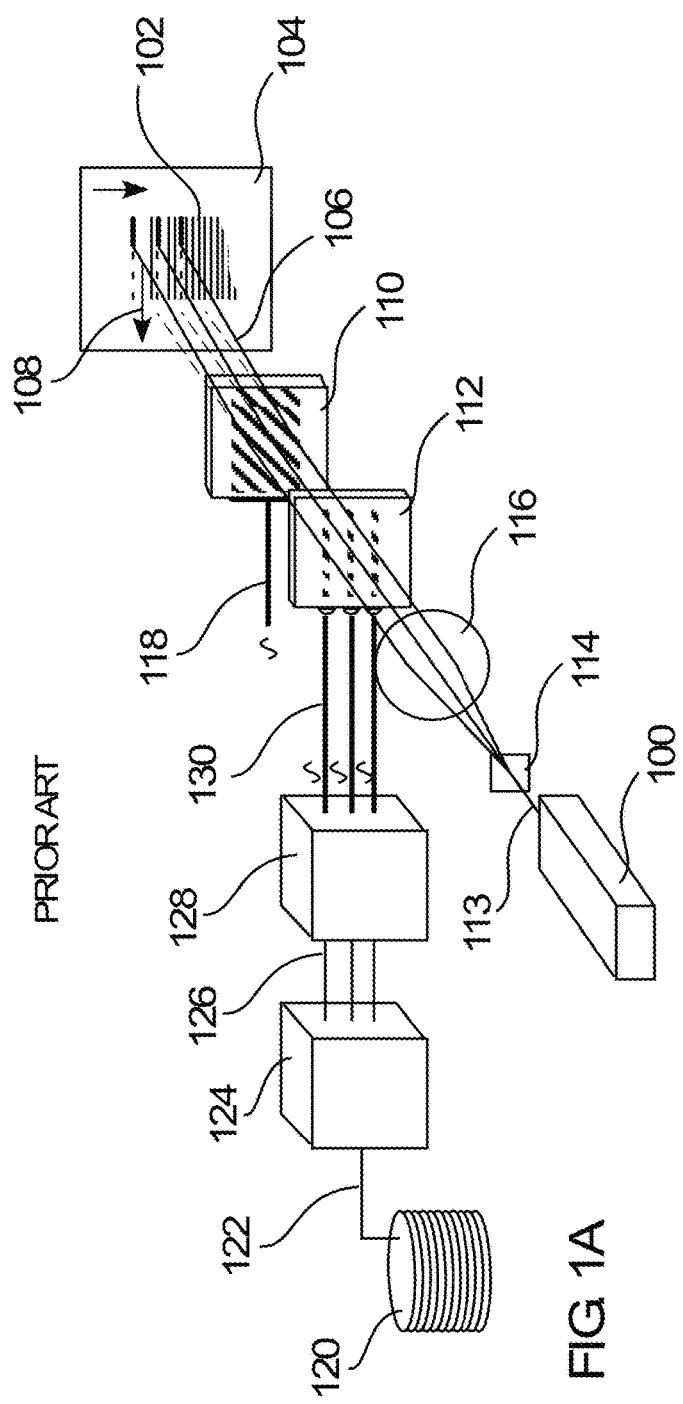
FIG. 1A shows a multibeam laser scanner, as known in prior art.

A multibeam laser scanner, as known in prior art, is shown in FIG. 1A. The scanner of FIG. 1A could for example be a microlithographic laser writer for writing a pattern on a photomask, or for direct writing of a pattern on a substrate such as a printed circuit board. A laser 100 emits a beam 113 which is divided into multiple beams 116 by a beam-splitter 114. Each beam is modulated by a multibeam acousto-optic modulator (AOM) 112 and deflected by a deflector 110, (could also be a polygon, mirror galvanometer, etc.) so that it scans 108 over the surface of the workpiece. The optics is symbolically shown as a single lens 116. The multibeam acousto-optic modulator 112 accepts a modulated RF signal 130 for each beam which is generated in the RF driver 128 which modulates the video 126 on an RF carrier. The RF is typically amplitude modulated with the carrier. The input pattern is stored in memory 120 and converted by a rasterizer 124 to the video used by the RF driver.

Figure 1B:
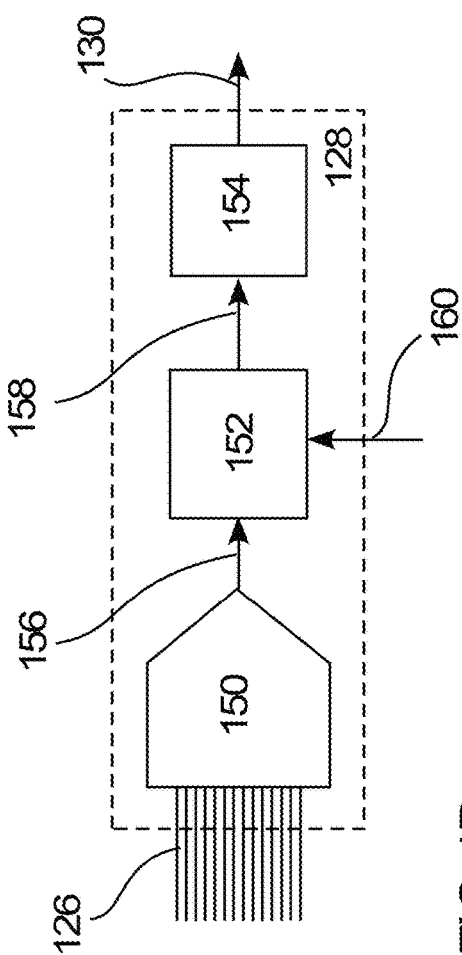
FIG. 1B shows the radio frequency (RF) driver of FIG. 1A in detail, as known in prior art.

FIG. 1B shows the RF driver in more detail. The input is a digital signal 126 which contains gray values for each pixel. The gray values are converted to an analog voltage 156 by the DAC 150. The analog voltage, typically ranging from 0 to 1 volt, modulates the carrier 160 from the local oscillator to produce a low-level modulated RF 158 which is then amplified in an RF amplifier to a power level suitable for the acousto-optic modulator, often 1-5 watts per channel.

An acousto-optic modulator (AOM) uses sound waves within a crystal to create a diffraction grating. As the power of the applied RF signal is varied, the amount of diffracted light varies proportionally. Acousto-optic multi-channel modulators allow multiple beams to be modulated independently by integrating an array of transducers with a single acousto-optic crystal. FIG. 2A shows an example spatial dimension graph for a multi-channel AOM with an array of fifteen channels of transducers integrated with a single acousto-optic crystal, operated at a carrier frequency of 220 MHz 242. A multi-channel AOM operates on the same principles as a typical AOM, and is fabricated using an array of electrodes on the transducer substrate so that a parallel array of beams can be simultaneously controlled. The AOM is typically operated with the same carrier frequency on all channels. A different acoustic wave diffracts each input beam independently to modulate its intensity. As the number of channels incorporated into a single device increases, so does the acoustic crosstalk between the various modulation channels. Under these conditions sound waves leaking from adjacent AOM channels will interact and create a 3-dimensional pattern such as the one shown in FIG. 2B, within the AOM-crystal, consisting of volumes with constructive and destructive interference. This pattern is static in time and will imprint an amplitude distortion on the laser beams being modulated by the AOM. This in turn has a negative impact on the line-width control of the exposed pattern. The overall effect on the total transmitted optical energy is small, typically less than 1%, confirmed in previous tests. The crosstalk modulates the shape of the Gaussian laser beam, giving relatively large impacts on the measured line width of exposed pattern structures. The disclosed technology reduces the impact of cross-talk between transducers that drive a multi-channel AOM.

Experimental results that led to the disclosed technology are described next. Unexpected CD variation was encountered that needed to be diagnosed. The test patterns written to investigate this problem showed a periodic variation in CD accuracy across beams that varied between patterning runs. The periodicity led to investigation of AOM performance and discovery of a problem resulting from cross-talk between neighboring transducers driving modulation channels of the AOM. Careful study and simulation led to an understanding of coherence effects within the AOM crystal that were impacting CD accuracy and to the disclosed approach to addressing the coherence effects that were discovered.

Signal amplitudes for individual beams in the multibeam scan are calculated to give the same exposure dose, and should result in the same line width, written via the different beams. With control over the exposure dose, it is expected that the scanner will measure the same line width, written via different beams.

Figure 3A:
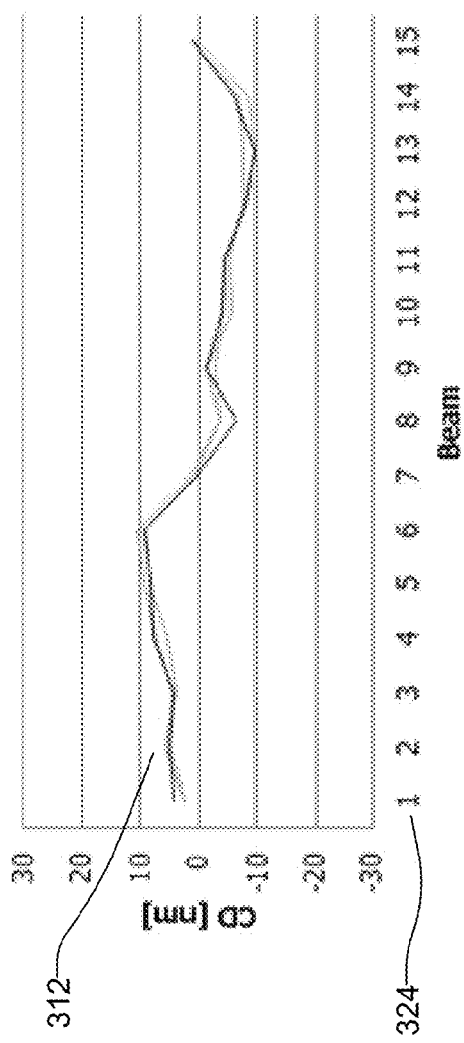
FIG. 3A shows a graph of measured line width critical dimension (CD) per unit time for three different patterning runs represented using three different colors.

Researchers used two types of test patterns to evaluate the relative dose in the different exposure beams. For the test patterns, a measure of the exposure dose is the width of the structures exposed by the different beams. Researchers used skew pattern A and measured line width, with only one of the exposure beams on at any given moment. FIG. 3A shows a graph of the results for pattern A, of measured line width critical dimension (CD) per unit time 324 for exposures across three different patterning runs 312 represented using three different colors. The results for the three different exposure patterns are very similar, with the same range of CD of between +10 and −10 nm. The measurement of static crosstalk resulted in power modulations of less than 1%.

Figure 3B:
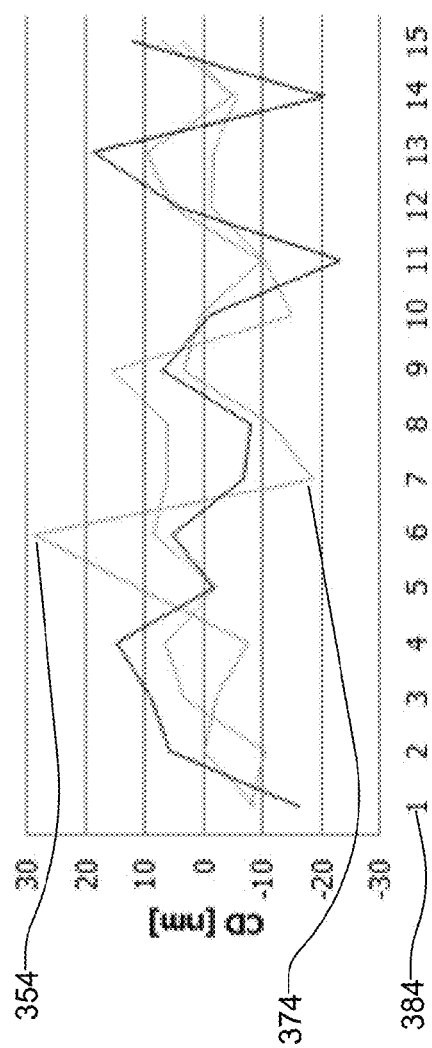
FIG. 3B shows a graph of measured line width critical dimension (CD) per unit time results for a second test pattern in which the set of transducer beams were turned on at the same time.

As a second test with pattern B, researchers used a stable and repeatable transducer input signal and measured line width, with all beams exposed (turned on) at the same time. From job to job the exposure dose did not change. For a multi-channel acousto-optic modulator, some kind of crosstalk is expected when sending acoustic energy into the crystal. In this experiment, 15 transducers were mounted, spaced separated by 0.9 nm, on a single monolithic quartz crystal the size of a sugar cube and fed by independent electronics. FIG. 3B shows the results for pattern B. The results changed a lot from job to job, for three different patterning runs, represented in the graph using three different colors. For the inputs described, the critical dimensions (CD) per unit time 384 for the width of structures exposed by the different beams covered a range between approximately −20 nm 374 and +30 nm 354. When all 15 transducer beams were exposed at the same time, a fully developed crosstalk situation ensued. The typical relationship between CD for line width and dose for this exposure mode is 4 nm per percent, which translates to a spread in exposure dose of up to 12% between consecutive exposures of the pattern. 12% corresponds to 48 nm in line-width variability, which is unacceptable. If interpreted as a true dose, pattern B indicates a dose variability of 10-15%.

The results for the two test pattern types show very different beam dose signatures. Cross-talk-driven exposure dose variations are not viewable in the static situation in which a single signal is active at any given time. Cross-talk is dependent on the phases of multi-channel input signals. If the phase is random from job to job, then the CD is random from job to job.

Phase-dependent cross talk between acousto-optic modulator (AOM) channels affects the CD: when the phase relationship between neighbor transducer channels changes, the impact on the apparent beam dose changes. In the research example, the 220 MHz carrier signal introduces a random phase relationship between the different transducer beams for each job, which is a cause of the variability between jobs. The phase relationship remained constant during a job but changed between jobs. That is, inter-channel cross-talk between modulators in a multi-channel AOM can have an adverse impact on critical dimensions (CD). When this problem was identified and fixed, the beam dose remained constant over jobs, reducing the impact of acoustic cross-talk between the modulators in the multi-channel AOM and thereby improving the critical dimensions for pattern generation, direct-write lithography and for optical writing of patterns on a photosensitive surface.

Careful study and simulation led to an understanding of coherence effects within the AOM crystal that were impacting CD accuracy. The spread frequency approach transforms static CD differences impacting CD-uniformity, into periodically changing CD along the sweep direction of the pattern writer. Experiments have shown that the nature of the crosstalk in the AOM is strongly dependent on the relative phase of the 220 MHz carrier signal in the different channels. By applying different frequencies in different AOM channels the phase relationship is constantly changing. This in turn modulates the crosstalk signature over time and smears the impact on exposed structures.

When different carrier frequencies are used on the different AOM channels the interference pattern will no longer be static. The interference pattern will travel through the crystal with a speed given by the frequency difference between adjacent AOM channels. The amplitude imprint on the laser beam will change over time and the impact on the exposure result will change as well. If these changes occur quickly enough, the overall impact on the exposure result will be an improvement compared to the default configuration with the same frequency on all channels.

Figure 4:
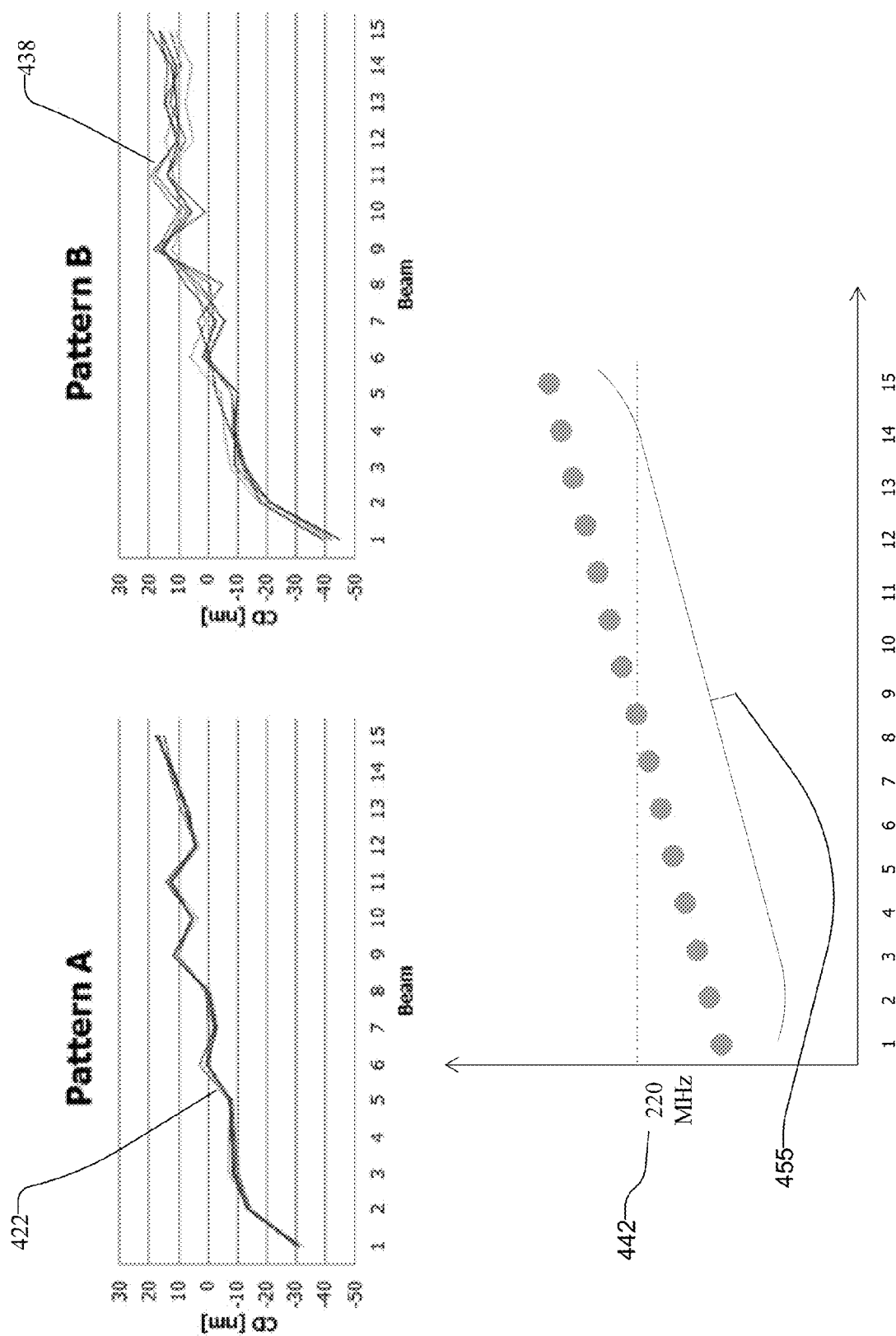
FIG. 4 shows spread carrier frequency approach results, for two tests in which 15 transducer channels, each fed by independent electronics, were assigned unique carrier frequencies. In the first test, only one of the exposure beams was turned on at any given moment. For the second test, all of the exposure beams were turned on at the same time.

FIG. 4 illustrates a spread carrier frequency approach, with each of 15 transducer channels 455 assigned a unique carrier frequency ranging from 216.5 to 223.5 MHz, centered around a frequency of 220 MHz 442 and fed by independent electronics. FIG. 4 pattern A 422 shows results for a test in which a single exposure beam for one of the 15 transducer channels 455 is turned on at any given moment. The graph shows measured line width, for the scenario in which only one of the exposure beams is turned on at any given moment. The graph shows measured line width critical dimensions (CD) per unit time for repeated exposures across three different exposure patterns represented using three different colors in the graph. The results for the three different exposures are very similar. FIG. 4 also shows results for test pattern B 438 in which all of the exposure beams are turned on at the same time, again using very slightly different carrier frequencies for each of the 15 transducers, so the pattern types were nearly in agreement on the beam doses. For the inputs described, the critical dimensions (CD) per unit time for the width of structures exposed by the different beams covered a range of less than 10 nm at any given moment in time. That is, the modulation of the line width corresponds to the frequency difference between two adjacent AOM channels, in the spread frequency approach.

Inter channel crosstalk in a multi-channel AOM causes the phase relationship between neighboring channels to have an impact on the beam dose. Thus, each beam experiences the effects of an interference wave pattern generated by acoustic energy spread from at least the closest transducer channel in the AOM crystal. With a change in phase of the carrier frequency, the standing wave pattern will move and the impact on the beams will change. With different carrier frequencies on the channels, the standing wave pattern will move and smear the effect over time.

Figure 5:
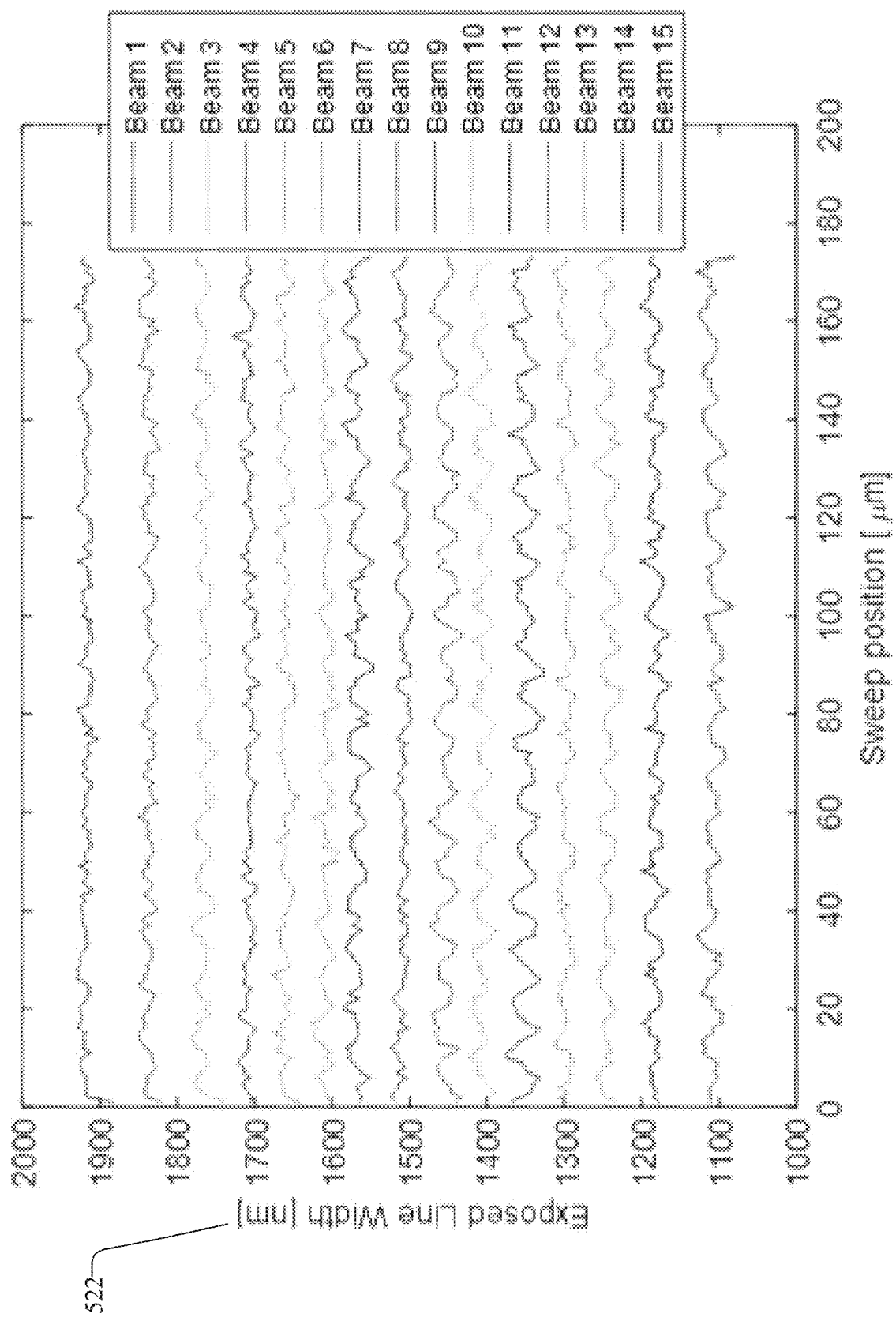
FIG. 5 shows spread carrier frequency approach results for the measured critical dimension for a highlighted segment with all of the transducers turned on at the same time.

FIG. 5 shows the sweep position in micrometers, as a function of the exposed line width in nanometers 522. In FIG. 5, the uppermost line in the graph corresponds to beam 1, the second line from the top corresponds to beam 2, and so forth. This illustrates spread carrier frequency approach results for the measured critical dimension, when the fifteen transducers are turned on at the same time, for the test in which 15 transducer beams were each given unique carrier frequencies, ranging from 216.5 to 223.5 MHz. The modulation of the line width corresponds to the frequency difference between two adjacent AOM channels.

AOM bandwidth affects exposure results, which will benefit from faster moving interference patterns in the AOM crystal achieved by increasing the difference in carrier frequency between adjacent AOM channels. There is a limit to how much the carrier frequency can deviate from the designed 220 MHz utilized in the described example. The limitation can be understood by considering the bandwidth of the AOM and the effects of impedance matching of the electronics in the AOM. Offsetting the carrier frequency very far from the most efficient frequency attenuates the optical transmission, resulting in lower available writing power. This result may be compensated by increasing the laser power. There is however a limit to the feasibility of this approach. Traditionally AOMs have been designed to a narrow bandwidth, according to the classical requirements. Note that the design of the AOM may be changed to increase the bandwidth, enabling a larger spread in carrier frequency.

Simulations led to further understanding of coherence effects, within the AOM crystal, that impact CD accuracy. When many transducers are mounted on a single monolithic quartz crystal, the side-lobes of neighboring transducer signals interact to create a complex interference pattern of sound waves, even when the transducers are fed by independent electronics. The neighboring channel crosstalk impacts the beam dose. The simulation shows the effect of side lobes of nearby transducer signals, with coherence effects caused by the phase relationship of crosstalk between neighboring channels in the multi-channel AOM.

Figure 6:
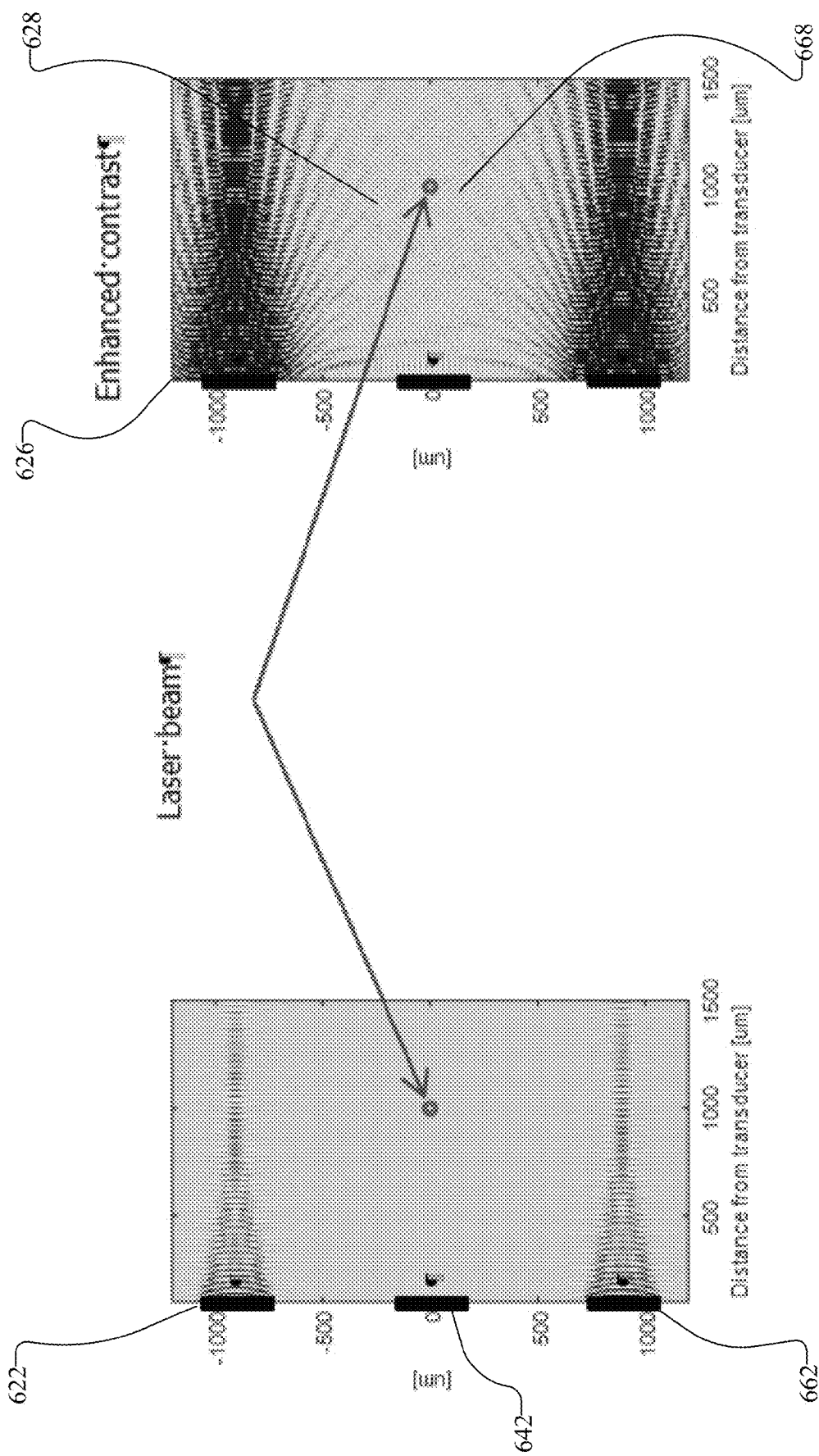
FIG. 6 shows a simulation of interference from neighboring transducers that affects a center transducer.

FIG. 6 shows a simulation of interference from neighboring transducers 622, 662 that affects a center transducer 642. The effects of the side lobes of two neighboring transducer signals become visible in the enhanced contrast image 626, with side lobe interference 628 caused by transducer one 622 and side lobe interference 668 caused by transducer three 662.

Figure 7:
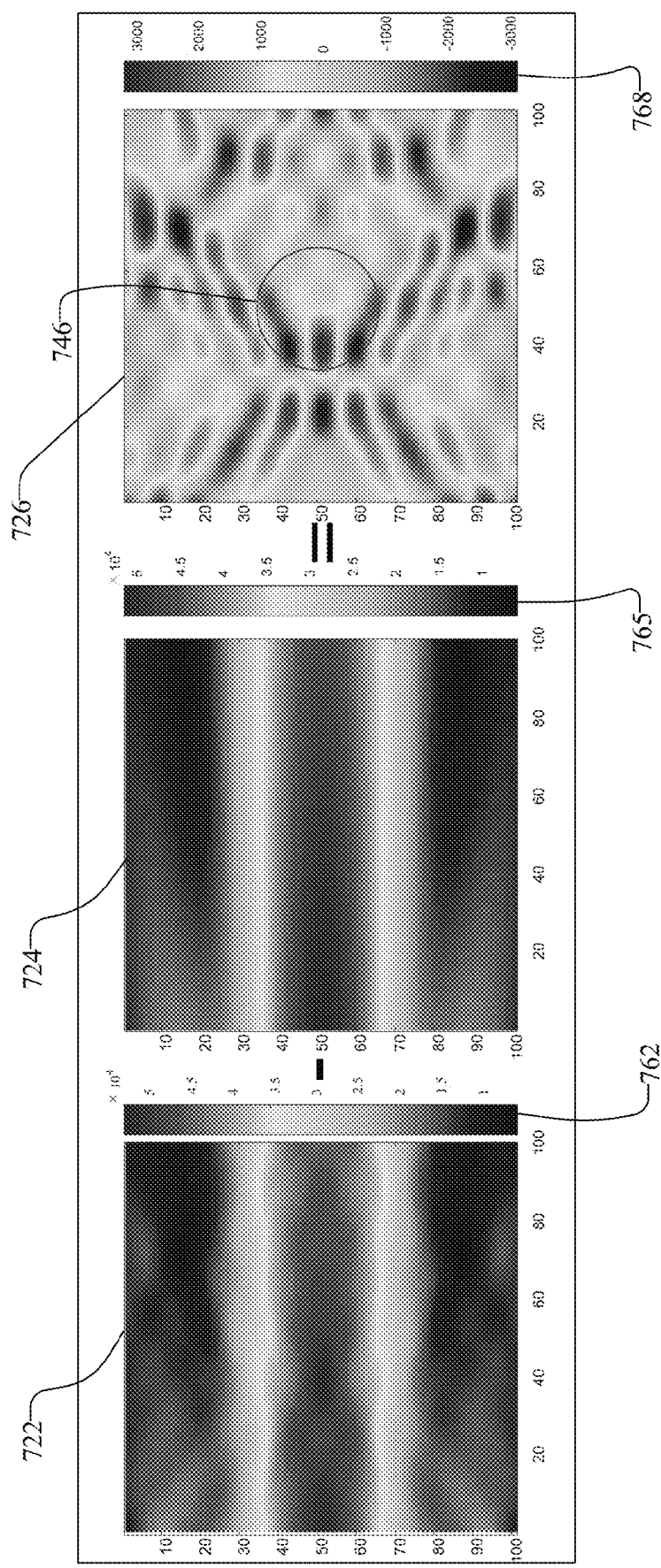
FIG. 7 displays a simulation of average energy disturbance that will be imprinted in the energy distribution over the laser beam, from two neighboring channel signals.

FIG. 7 displays a simulation of average energy disturbance that will be imprinted in the energy distribution over the laser beam, from two neighboring channel signals. The simulation calculates the effect of subtracting the energy of an undisturbed single transducer channel signal 724 from the average acoustic energy in the crystal 722, which is calculated by integrating over the period of the 220 MHz signal. The subtraction yields the average energy disturbance from the two neighbor channels 726. This pattern 746 will be imprinted in the energy distribution over the laser beam. The color scales 762, 765, 768 are displayed to the right of each of the color energy maps.

Figure 8:
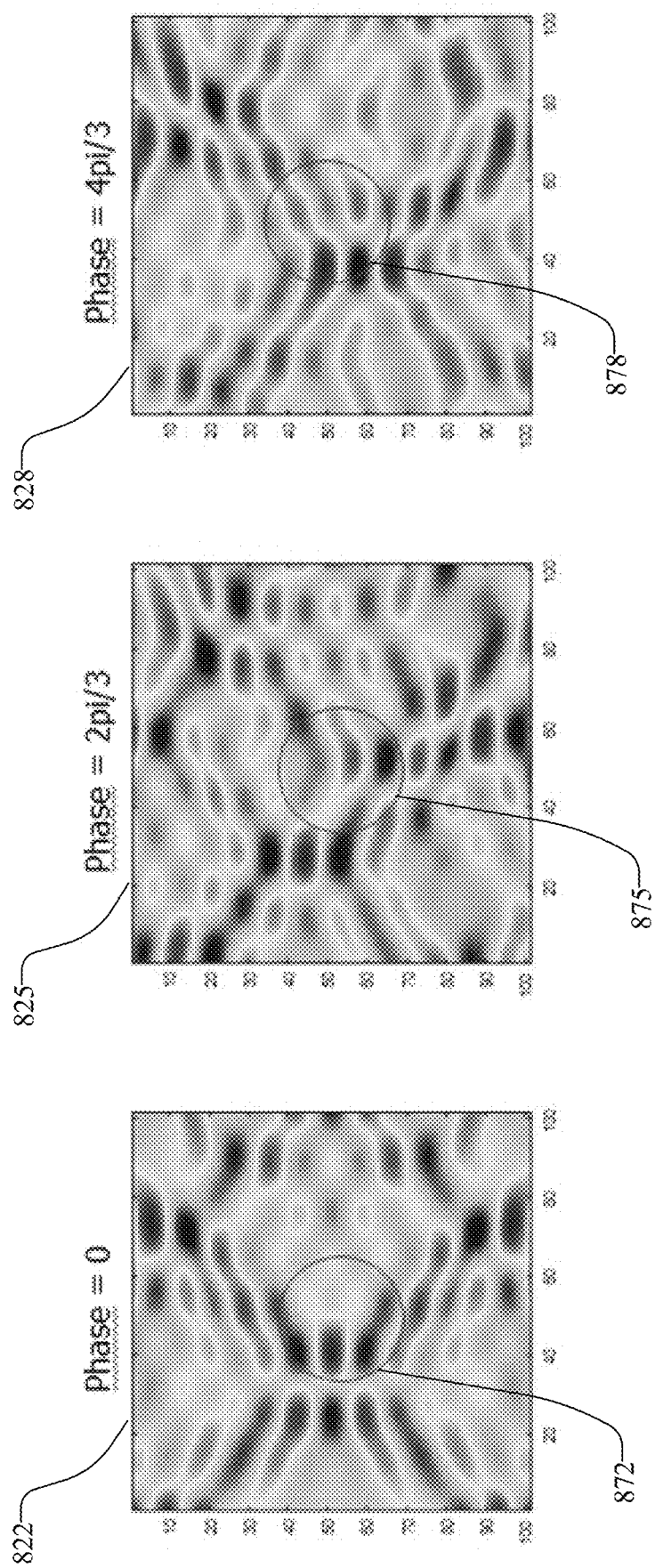
FIG. 8 displays a simulation of the average energy disturbance that will be imprinted in the energy distribution over the laser beam for three different phase relationships.

Another simulation of phase relationships on coherence effects within the AOM crystal also led to the disclosed approach for addressing the coherence effects that were discovered. Continuing with phase-based simulations, when the phase of one of the neighbor channels is changed, the geometry of the interference pattern changes. FIG. 8 displays a simulation of the average energy disturbance that will be imprinted in the energy distribution over the laser beam for three different phase relationships. FIG. 8 shows the average energy disturbance when there is no phase change 822 which results in energy disturbance 872. FIG. 8 also shows the effect when there is a phase relationship of 2/3 pi 825, resulting in energy disturbance 875, and when there is a phase relationship of 4/3 pi 828 resulting in energy disturbance 878. This simulation sheds light on the effect on the CD of carrier frequency phase changes of transducer signals. This simulation explains the effect on the line width of exposed structure changes with carrier frequency phase.

Figure 9:
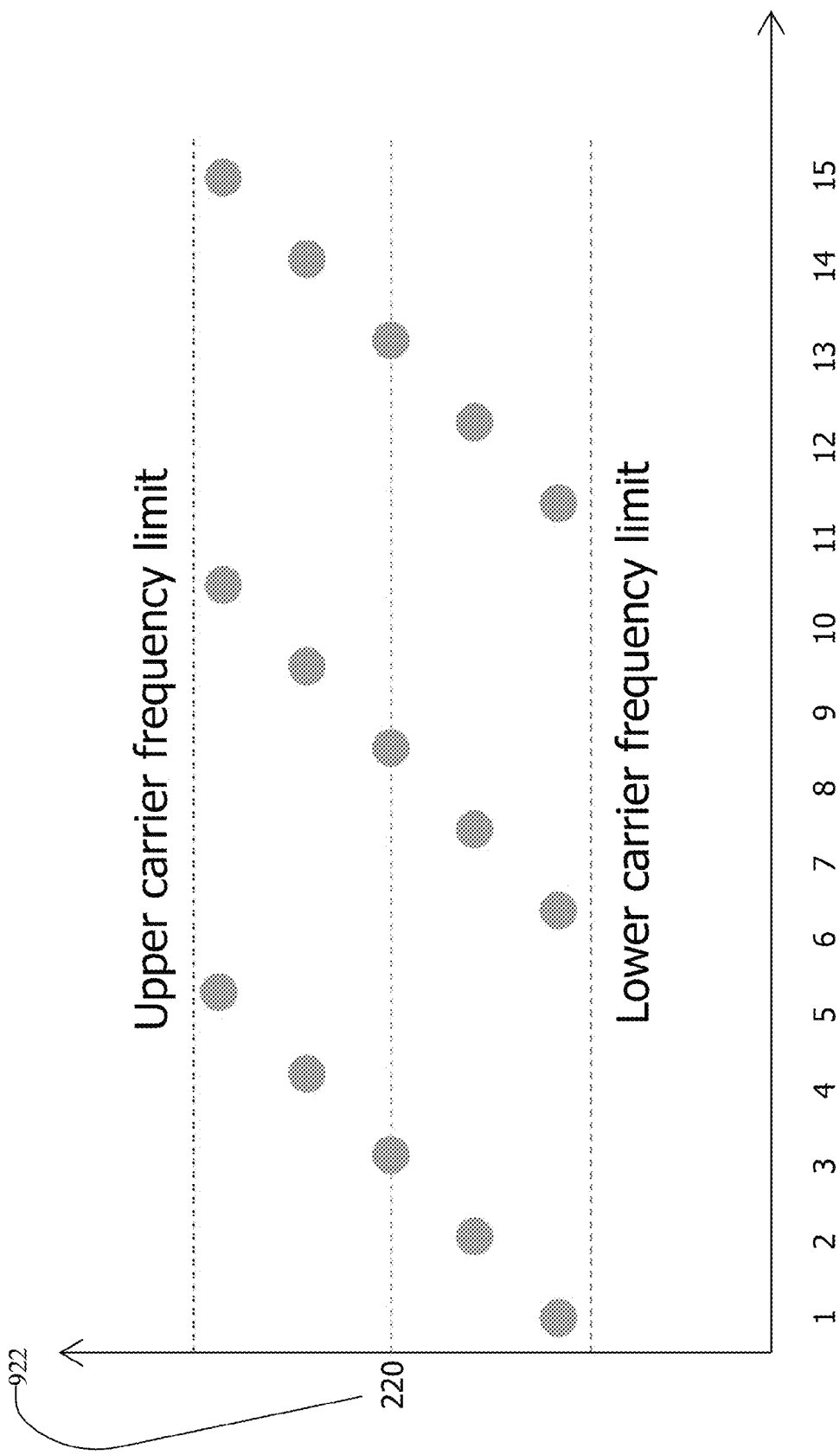
FIG. 9 shows an example sawtooth distribution of channel frequencies in an AOM with 15 transducer channels.

FIG. 9 illustrates a saw-tooth configuration, with a central frequency 922, for a channel distribution that utilizes the concept that acoustic crosstalk is limited in space and fades as distance increases from the transducer in the AOM. This addresses the limit of how much the carrier frequency may spread through the AOM before resulting in a lower optical transmission, as described supra. A large carrier frequency offset for the nearest neighbors in the AOM crystal mitigates the effects of the acoustic crosstalk. A distant neighbor may, due to the large distance, be close in frequency. The impact from this distant neighbor is weak enough not to be a problem due to its large spatial separation.

Figure 10:
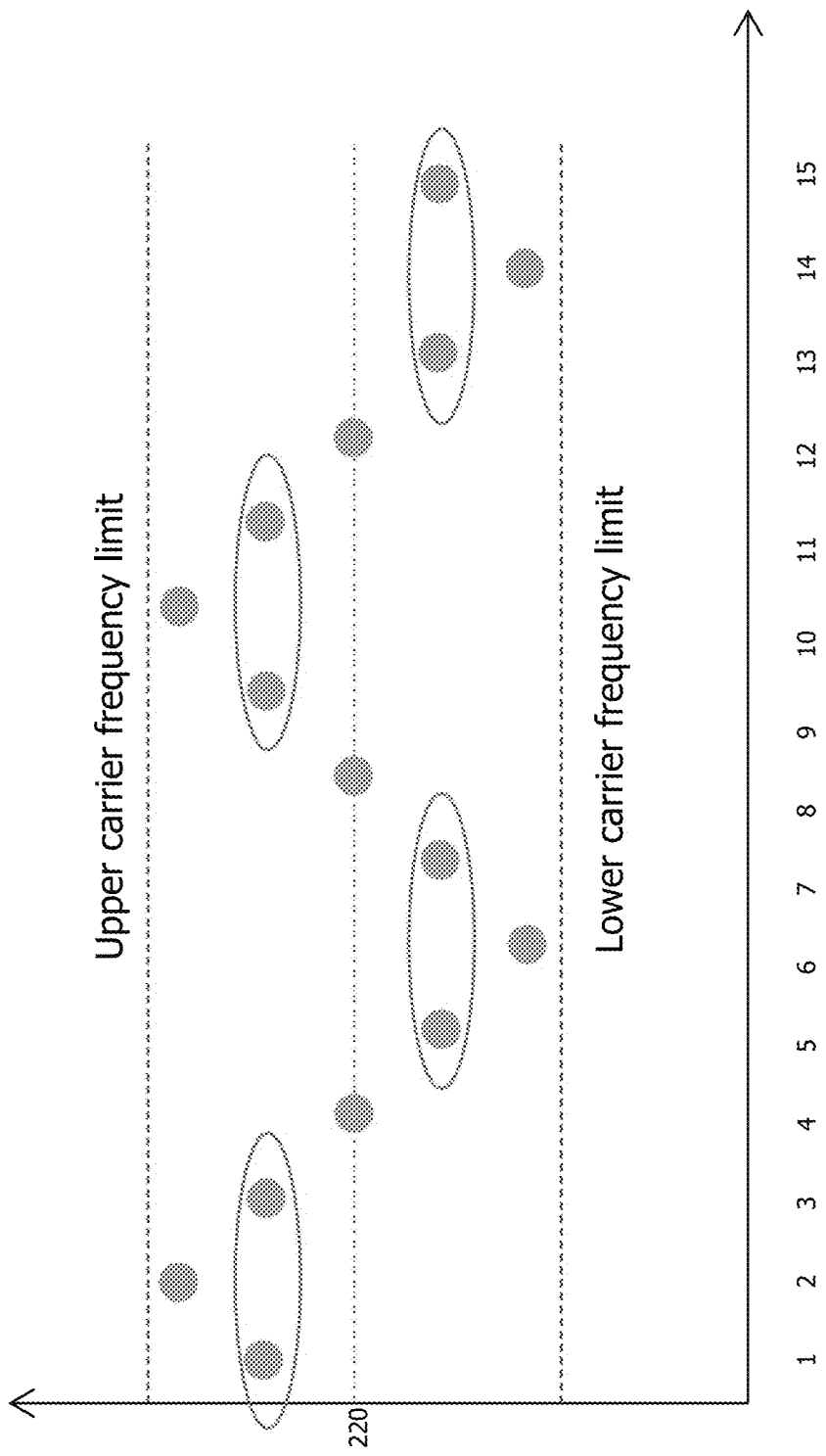
FIG. 10 shows an example step distribution of channel frequencies in an AOM with 15 transducer channels.

FIG. 10 illustrates an example stair configuration of channel frequency distribution in an AOM. The x axis shows the fifteen different AOM channels, in the spatial dimension and the y axis shows the AOM carrier frequency for each of the channels, centered on a 220 Mhz carrier frequency. In this arrangement with a staircase distribution of frequencies, repeated pairs of channels, separated only by one channel in the spatial dimension, utilize the same carrier frequency, so these pairs will be the weakest link in the design.

Next, we describe a computer system usable for generating modulated RF signal 130 for driving the AOM channels.

Computer System

Figure 11:
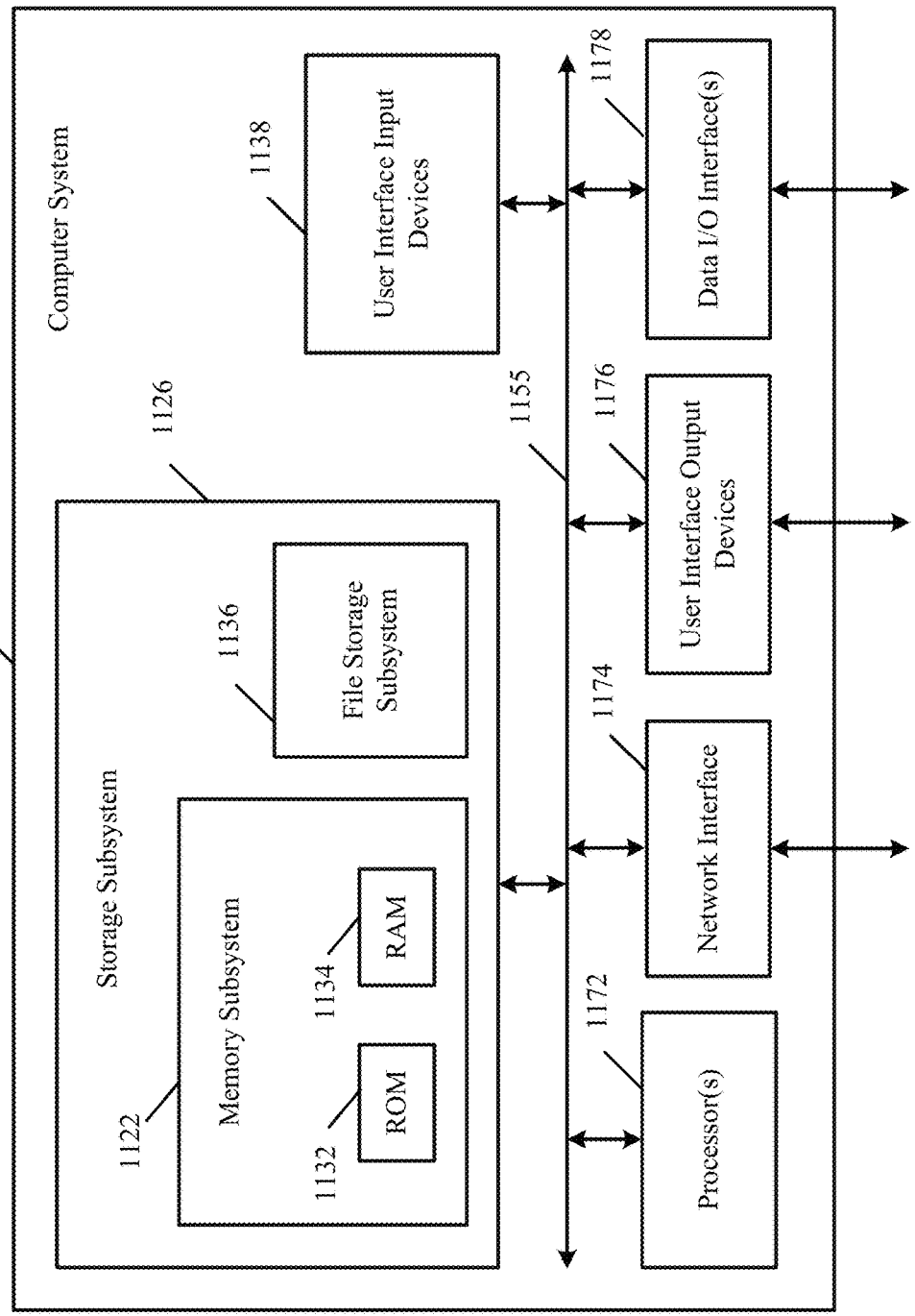
FIG. 11 depicts a block diagram of an exemplary system for generating modulated RF signals for driving AOM channels, according to one implementation of the technology disclosed.

FIG. 11 is a simplified block diagram of a computer system 1100 that can be used for generating modulated RF signals for driving the AOM channels, according to one implementation of the technology disclosed.

Computer system 1100 includes at least one central processing unit (CPU) 1172 that communicates with a number of peripheral devices via bus subsystem 1155. These peripheral devices can include a storage subsystem 1110 including, for example, memory devices and a file storage subsystem 1136, user interface input devices 1138, user interface output devices 1176, and a network interface subsystem 1174. The input and output devices allow user interaction with computer system 1100. Network interface subsystem 1174 provides an interface to outside networks, including an interface to corresponding interface devices in other computer systems.

User interface output devices 1176 can include a display subsystem or non-visual displays such as audio output devices. The display subsystem can include an LED display, a flat-panel device such as a liquid crystal display (LCD), a projection device, a cathode ray tube (CRT), or some other mechanism for creating a visible image. The display subsystem can also provide a non-visual display such as audio output devices. In general, use of the term "output device" is intended to include all possible types of devices and ways to output information from computer system 1100 to the user or to another machine or computer system.

Memory subsystem 1122 used in the storage subsystem 1110 can include a number of memories including a main random-access memory (RAM) 1132 for storage of instructions and data during program execution and a read only memory (ROM) 1134 in which fixed instructions are stored. A file storage subsystem 1136 can provide persistent storage for program and data files, and can include a hard disk drive, a floppy disk drive along with associated removable media, a CD-ROM drive, an optical drive, or removable media cartridges. The modules implementing the functionality of certain implementations can be stored by file storage subsystem 1136 in the storage subsystem 1110, or in other machines accessible by the processor.

Bus subsystem 1155 provides a mechanism for letting the various components and subsystems of computer system 1100 communicate with each other as intended. Although bus subsystem 1155 is shown schematically as a single bus, alternative implementations of the bus subsystem can use multiple busses.

Computer system 1100 itself can be of varying types including a personal computer, a portable computer, a workstation, a computer terminal, a network computer, a television, a mainframe, a server farm, a widely-distributed set of loosely networked computers, or any other data processing system or user device. Due to the ever-changing nature of computers and networks, the description of computer system 1100 depicted in FIG. 11 is intended only as a specific example for purposes of illustrating the preferred embodiments of the present invention. Many other configurations of computer system 1100 are possible having more or less components than the computer system depicted in FIG. 11. The computer system can be used to control a microlithography laser writer, such as a laser writer for large area masks or smaller, semi-conductor masks. The microlithography writer can be a multi-beam writer.

The preceding description is presented to enable the making and use of the technology disclosed. Various modifications to the disclosed implementations will be apparent, and the general principles defined herein may be applied to other implementations and applications without departing from the spirit and scope of the technology disclosed. Thus, the technology disclosed is not intended to be limited to the implementations shown, but is to be accorded the widest scope consistent with the principles and features disclosed herein. The scope of the technology disclosed is defined by the appended claims.

Some Particular Implementations

Some particular implementations and features are described in the following discussion.

In one implementation, a disclosed method of reducing impact of cross-talk between transducers that drive an acousto-optic modulator (AOM) includes operating the transducers, which are coupled to an acousto-optic medium, with different frequencies applied to adjoining transducers and producing a time varying phase relationship between carriers on spatially adjoining modulation channels emanating from the adjoining transducers.

The method described in this section and other sections of the technology disclosed can include one or more of the following features and/or features described in connection with additional methods disclosed. In the interest of conciseness, the combinations of features disclosed in this application are not individually enumerated and are not repeated with each base set of features. The reader will understand how features identified in this method can readily be combined with sets of base features identified as implementations.

The disclosed method also includes operating the transducers with the frequencies having differences between pairs of adjoining transducers of at least 100 KHz and a maximum difference of 20 MHz. For some implementations of the disclosed method frequency differences between pairs of adjoining transducers is in a range of 400 KHz to 10 MHz.

Some implementations of the disclosed technology include operating between 5 and 32 of the transducers to produce 5 to 32 modulation channels in the acousto-optic medium.

In one implementation of the disclosed method, the different frequencies between the spatially adjoining modulation channels are arranged in a sawtooth pattern.

In another implementation of the disclosed method, the different frequencies between the spatially adjoining modulation channels are arranged in a rising or falling pattern applied progressively to the adjoining transducers.

For some implementations of the disclosed method, the different frequencies vary between pairs of adjoining transducers by an amount in a range of plus or minus three percent from an average frequency applied to the transducers.

For one implementation of the disclosed technology, an acousto-optic modulator (AOM) with reduced impact of cross-talk between transducers that are part of the AOM, includes an acousto-optic medium, a plurality of transducers physically coupled to the acousto-optic medium, spaced apart to drive separate modulation channels within the acousto-optic medium, and a signal synthesizer coupled to the transducers that drives the transducers at different frequencies to produce a time varying phase relationship between spatially adjoining modulation channels.

The disclosed AOM can include operating the transducers with the frequencies having differences between pairs of adjoining transducers of at least 100 KHz and a maximum difference of 20 MHz in one case. In another implementation, the disclosed AOM includes frequency differences between pairs of adjoining transducers in a range of 400 KHz to 10 MHz.

One implementation of the disclosed AOM includes operating between 5 and 32 of the transducers to produce 5 to 32 modulation channels in the acousto-optic medium. For some implementations, the different frequencies between the spatially adjoining modulation channels are arranged in a sawtooth pattern. In other implementations of the disclosed AOM, the different frequencies between the spatially adjoining modulation channels are arranged in a rising or falling pattern applied progressively to the adjoining transducers. In some implementations of the disclosed AOM, the different frequencies vary between pairs of adjoining transducers in an amount in a range of plus or minus five percent from an average frequency applied to the transducers.

The technology disclosed can be practiced as a system, method, or article of manufacture. One or more features of an implementation can be combined with the base implementation. Implementations that are not mutually exclusive are taught to be combinable. One or more features of an implementation can be combined with other implementations.

While the technology disclosed is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the innovation and the scope of the following claims.

I claim as follows:

1. A method of reducing impact of cross-talk between transducers that drive an acousto-optic modulator (AOM), including:
    operating the transducers, which are coupled to an acousto-optic medium, with different frequencies applied to adjoining transducers and producing a time varying phase relationship between carriers at the different frequencies on spatially adjoining modulation channels emanating from the adjoining transducers; and
    directing beams passing through the adjoining modulation channels to a deflector that scans the beams over the surface of a workpiece to form a pattern, whereby critical line width performance is improved.

2. The method of claim 1, further including operating the transducers with the frequencies having differences between pairs of adjoining transducers of at least 100 KHz and a maximum difference of 20 MHz.

3. The method of claim 2, wherein frequency differences between pairs of adjoining transducers is in a range of 400 KHz to 10 MHz.

4. The method of claim 1, further including operating between 5 and 32 of the transducers to produce 5 to 32 modulation channels in the acousto-optic medium.

5. The method of claim 1, wherein the different frequencies between the spatially adjoining modulation channels are arranged in a sawtooth pattern.

6. The method of claim 1, wherein the different frequencies between the spatially adjoining modulation channels are arranged in a rising or falling pattern applied progressively to the adjoining transducers.

7. The method of claim 1, wherein the different frequencies vary between pairs of adjoining transducers by an amount in a range of plus or minus three percent from an average frequency applied to the transducers.

8. A microlithographic laser writer configured to perform the method of claim 1.

9. A pattern writer, including an acousto-optic modulator (AOM), with reduced impact of cross-talk between transducers that are part of the AOM, the AOM optically coupled to a deflector that scans a workpiece to form a pattern, the AOM including:
    an acousto-optic medium;
    a plurality of transducers physically coupled to the acousto-optic medium, spaced apart to drive separate modulation channels within the acousto-optic medium; and
    a signal synthesizer coupled to the transducers that drives the transducers at different frequencies to produce a time varying phase relationship between carriers at the different frequencies spatially adjoining modulation channels, whereby critical line width performance is improved.

10. The AOM of claim 9, further including operating the transducers with the frequencies having differences between pairs of adjoining transducers of at least 100 KHz and a maximum difference of 20 MHz.

11. The AOM of claim 10, wherein frequency differences between pairs of adjoining transducers are in a range of 400 KHz to 10 MHz.

12. The AOM of claim 9, further including operating between 5 and 32 of the transducers to produce 5 to 32 modulation channels in the acousto-optic medium.

13. The AOM of claim 9, wherein the different frequencies between the spatially adjoining modulation channels are arranged in a sawtooth pattern.

14. The AOM of claim 9, wherein the different frequencies between the spatially adjoining modulation channels are arranged in a rising or falling pattern applied progressively to the adjoining transducers.

15. The AOM of claim 9, wherein the different frequencies vary between pairs of adjoining transducers in an amount in a range of plus or minus five percent from an average frequency applied to the transducers.

16. A microlithographic laser writer comprising an AOM of claim 9.

* * * * *